United States Patent [19]

Robinson

[11] 4,425,218

[45] Jan. 10, 1984

[54] GAS DISTRIBUTION SYSTEM FOR SPUTTERING CATHODES

[75] Inventor: Merrill G. Robinson, Ann Arbor, Mich.

[73] Assignee: Shatterproof Glass Corporation, Detroit, Mich.

[21] Appl. No.: 363,453

[22] Filed: Mar. 30, 1982

[51] Int. Cl.³ .............................................. C23C 15/00
[52] U.S. Cl. ................................. 204/298; 204/192 R
[58] Field of Search ................ 204/192 R, 192 C, 298

[56] References Cited

U.S. PATENT DOCUMENTS 3,976,555  8/1976  Von Hartel ........................ 204/192

FOREIGN PATENT DOCUMENTS 146757  3/1981  German Democratic Rep. ............................... 204/192 R
150480  9/1981  German Democratic Rep. ................................... 204/298
55-108725  8/1980  Japan .............................. 204/192 R Primary Examiner—G. L. Kaplan
Assistant Examiner—William Leader
Attorney, Agent, or Firm—William E. Nobbe

[57] ABSTRACT

A gas distribution system for use with a sputtering cathode mounted in a vacuum chamber and provided with a planar target formed of the material to be sputtered upon planar substrates passing therebeneath, in which two divergent streams of gas are introduced into the vacuum chamber, one of the gases being an inert gas directed into the upper portion of the chamber adjacent the target and the other gas being a reactive gas directed into the lower portion of the chamber adjacent the substrate.

5 Claims, 7 Drawing Figures

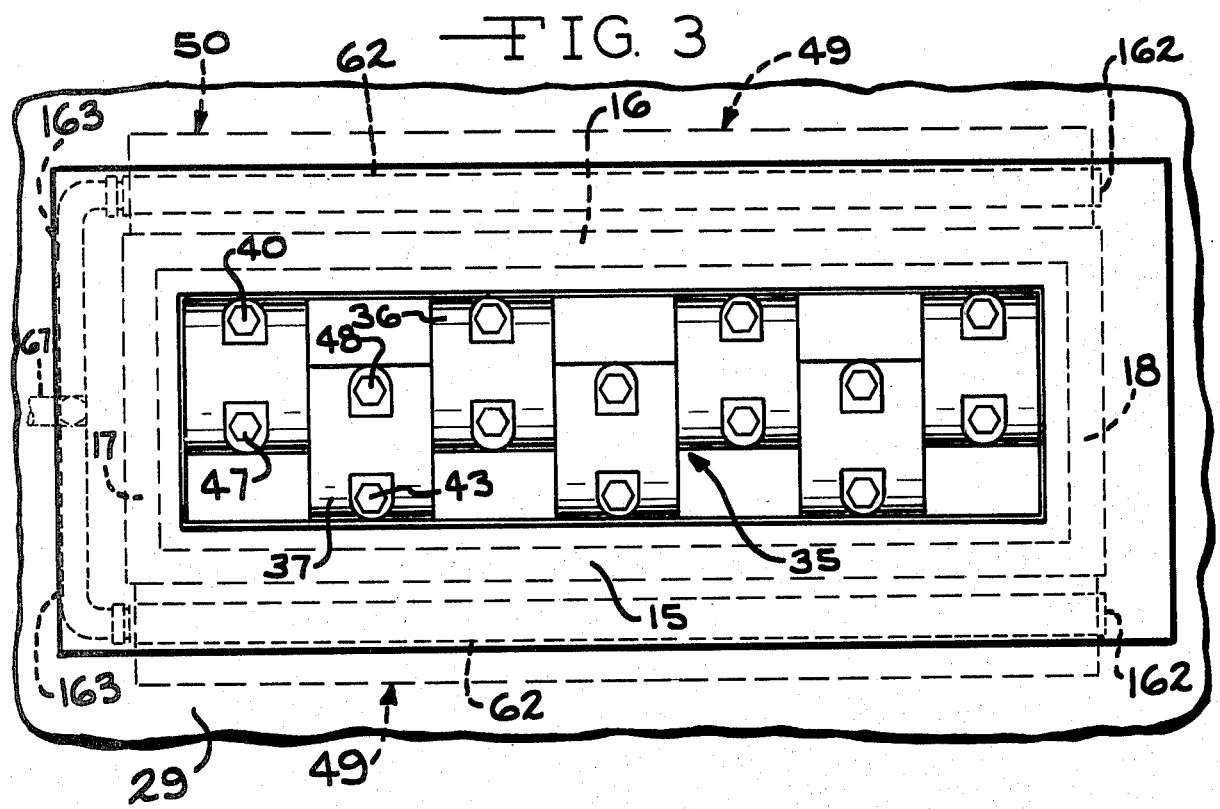
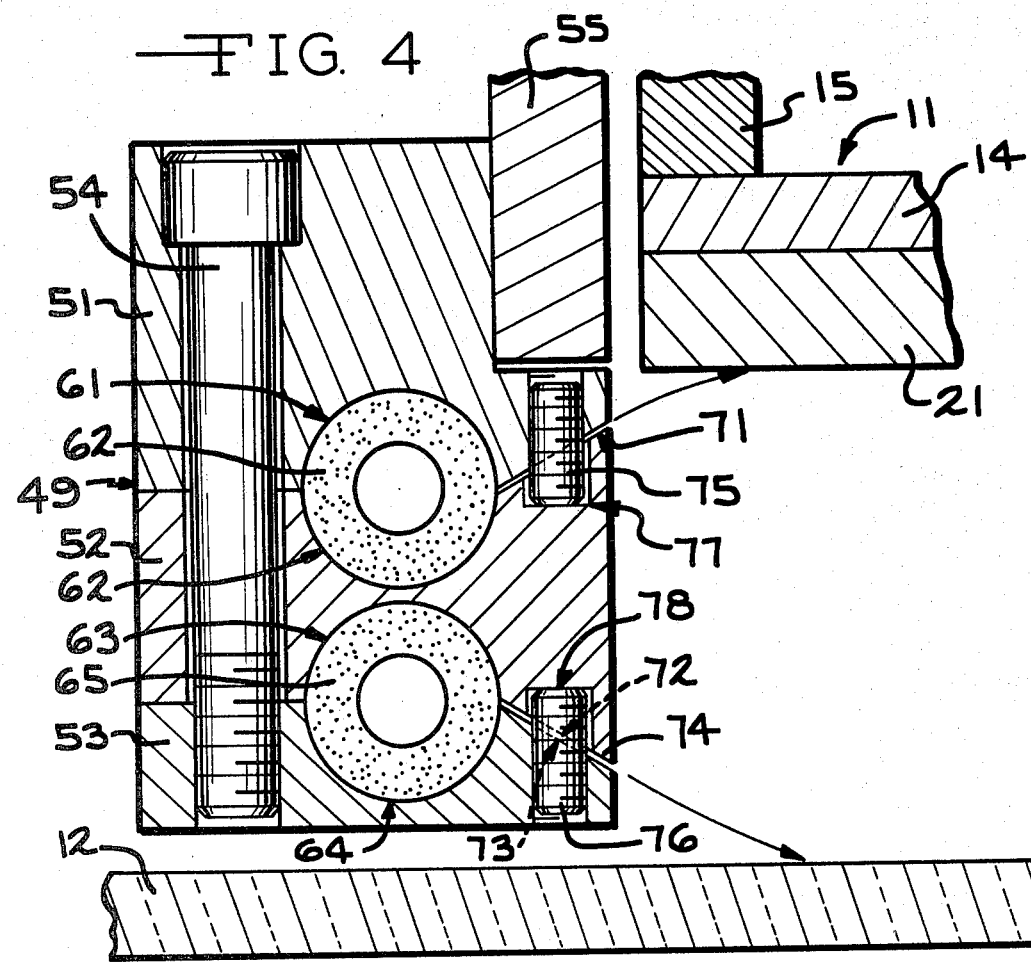

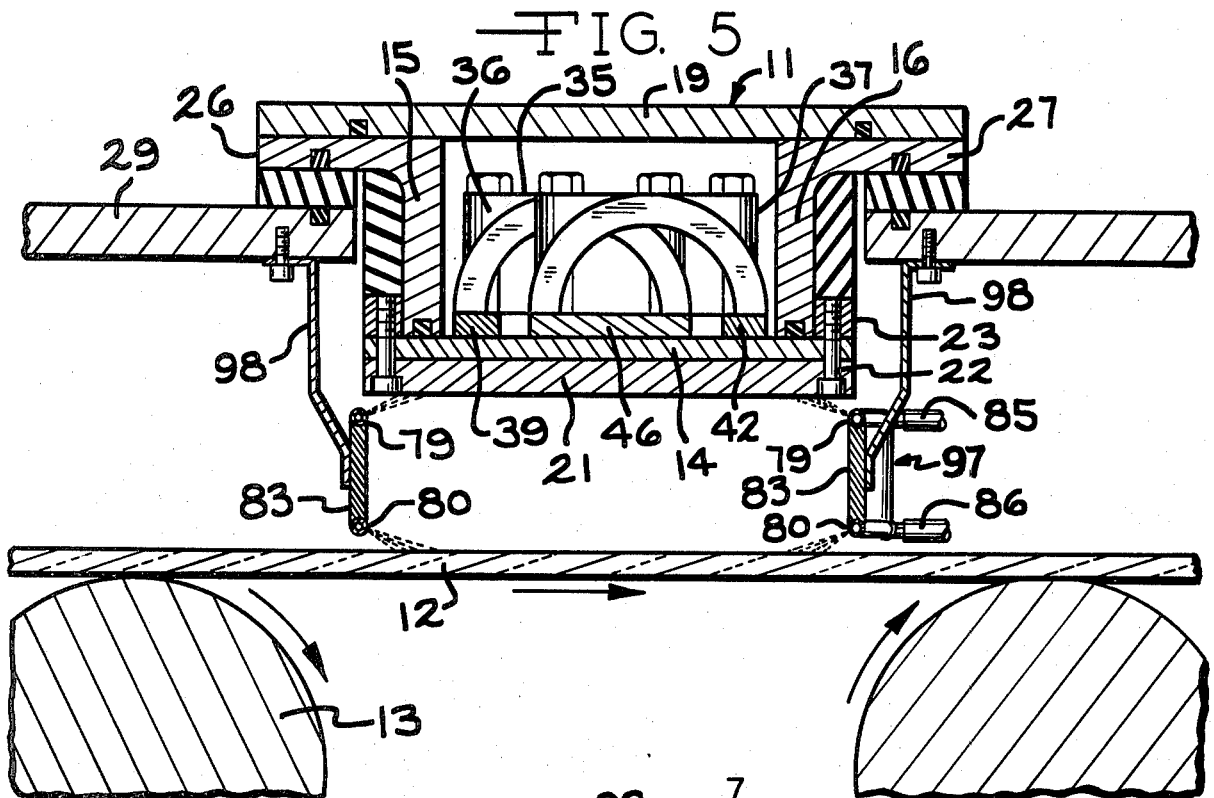
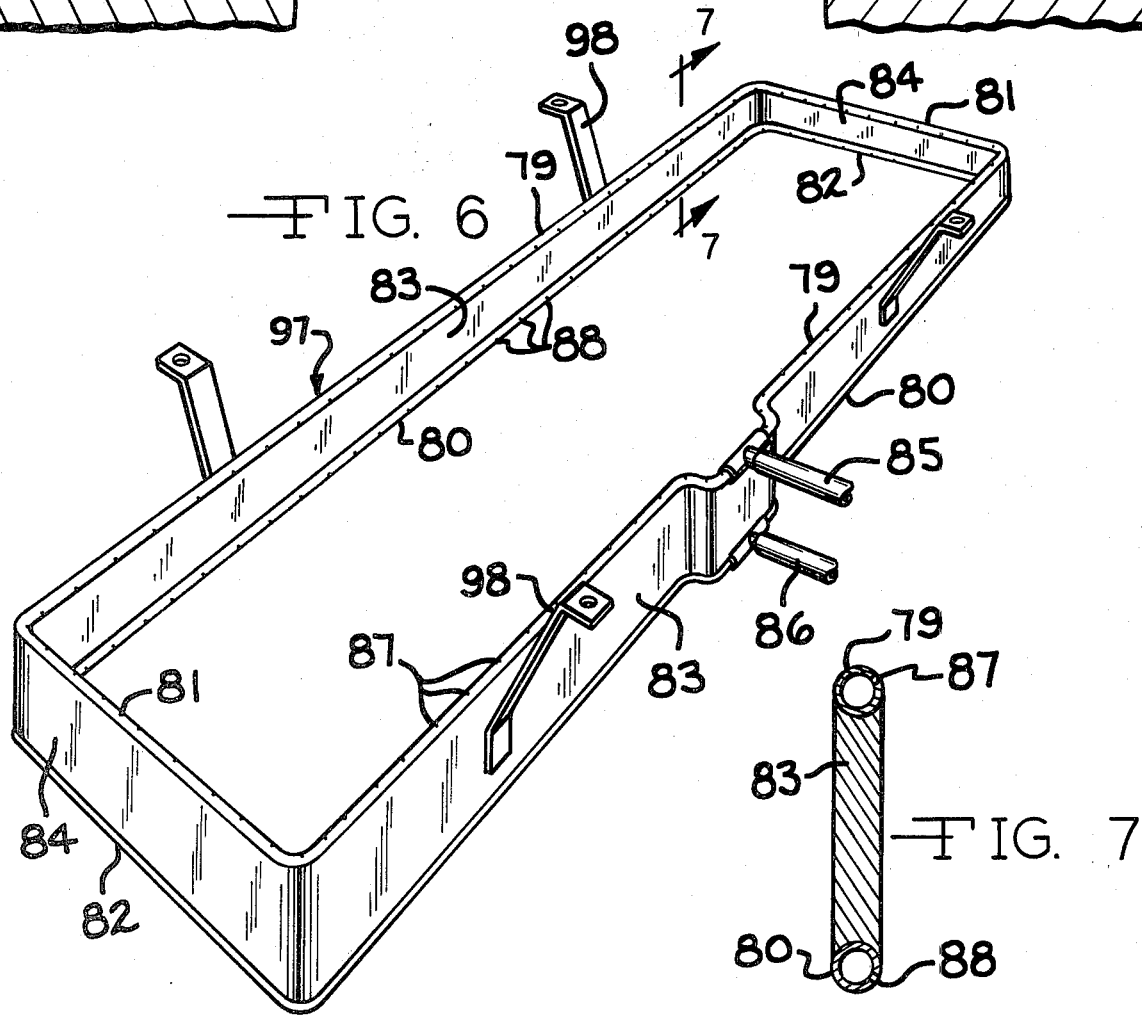

GAS DISTRIBUTION SYSTEM FOR SPUTTERING CATHODES

FIELD OF THE INVENTION

The present invention is concerned with the art of sputtering and in particular with the reactive cathodic sputtering of metals or metal alloys on the surface of substrates in an evacuable coating chamber.

BACKGROUND OF THE INVENTION

One method of sputter-coating involves ion bombarding a target of the coating material in an ionized gas atmosphere in a chamber in which a controlled vacuum is maintained to cause atomic particles of the coating material to be dislodged and deposited by condensation on the substrates to be coated. The gas employed is a non-reactive or inert gas, such as argon.

However, many processes in vacuum deposition utilize a method known as reactive deposition where a pure metal or alloy target material is liberated from it's bulk and directed toward a substrate which is intended to collect the material as or after it has reacted with a gas which is present in the path of the liberated target material or at the substrate surface.

The reactive sputtering is often difficult to control, rates of deposition are erratic, arcing of the target occurs due to resistive film build up on the target face, and yields are often unpredictable.

OUTLINE OF THE INVENTION

It is a primary purpose of this invention to provide a reactive sputtering method which embodies a novel gas distribution system designed to shield the target material from the reactive gases employed when an attempt is made to create a reaction between the target material and a reactive gas, such as nitrogen or oxygen.

In essence, the gas distribution system of this invention consists in simultaneously introducing into the coating chamber after it has been pumped down a non-reactive gas, such as argon, and a reactive gas, such as nitrogen or oxygen, and maintaining them substantially separate from one another, the non-reactive gas being directed toward and upon the target surface and serving to protect said surface from the reactive gas which is directed toward and upon the substrate surface.

Such a gas distribution system has assisted in eliminating many of the problems associated with reactive deposition. It provides for increased target rate of deposition; decreases power levels required; eliminates spiking or arcing; eliminates need to "pulse" gases to keep the target clean, and efficiency of conversion is high per unit gas volume, i.e. more efficient usage of reactive gas.

BRIEF DESCRIPTION OF THE DRAWINGS

FIG. 3 is a plan view of the cathode with the cover plate removed, FIG. 4 is an enlarged section of the gas distribution means of this invention, FIG. 5 is a view similar to FIG. 1 but showing another form of the invention, FIG. 6 is a perspective view of the gas distribution means shown in FIG. 5, and FIG. 7 is a detail section taken substantially on line 7—7 of FIG. 6.

DETAILED DESCRIPTION

Figure 1:
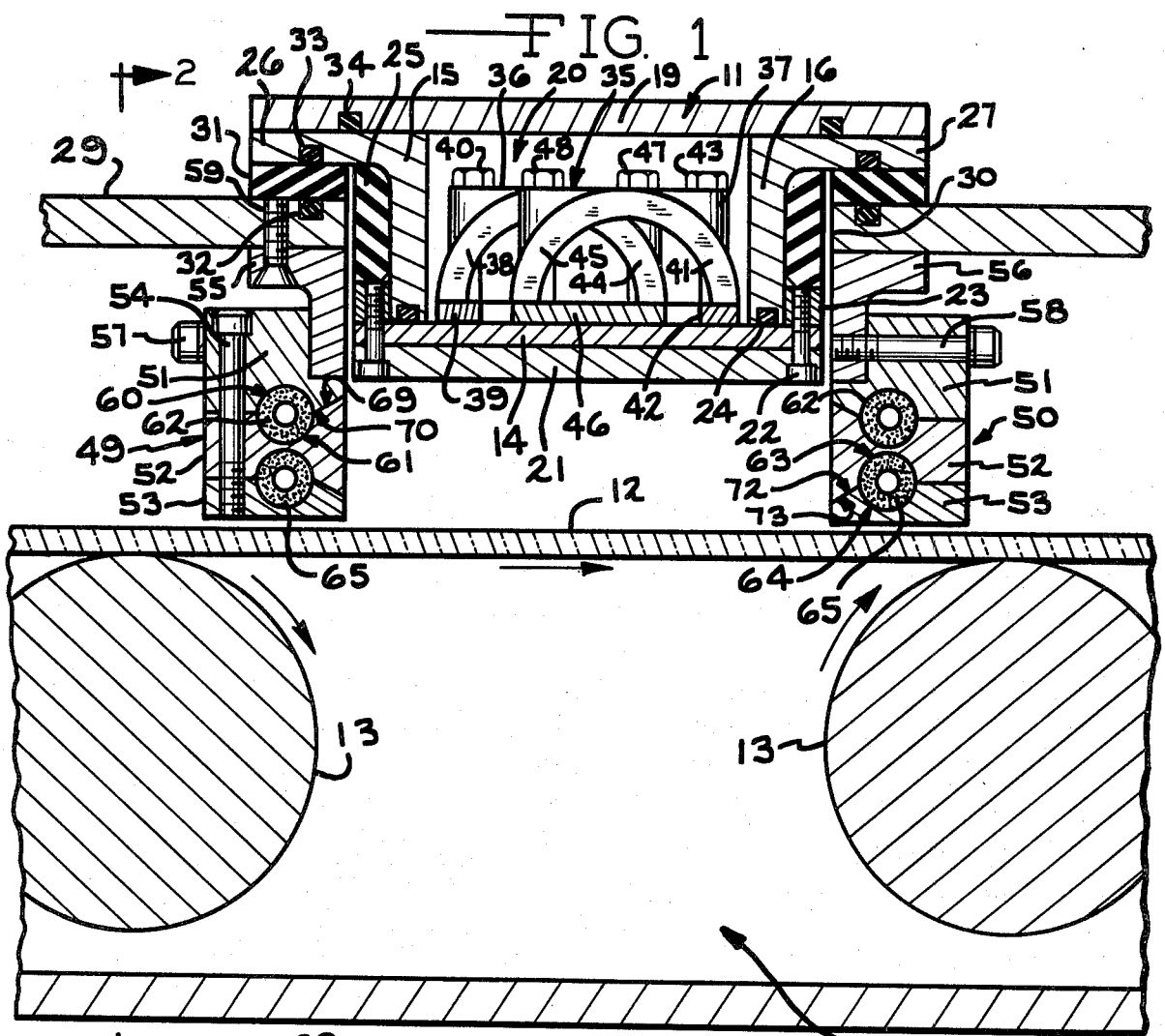
FIG. 1 is a cross section of a sputtering cathode with which the present invention is employed.
Figure 2:
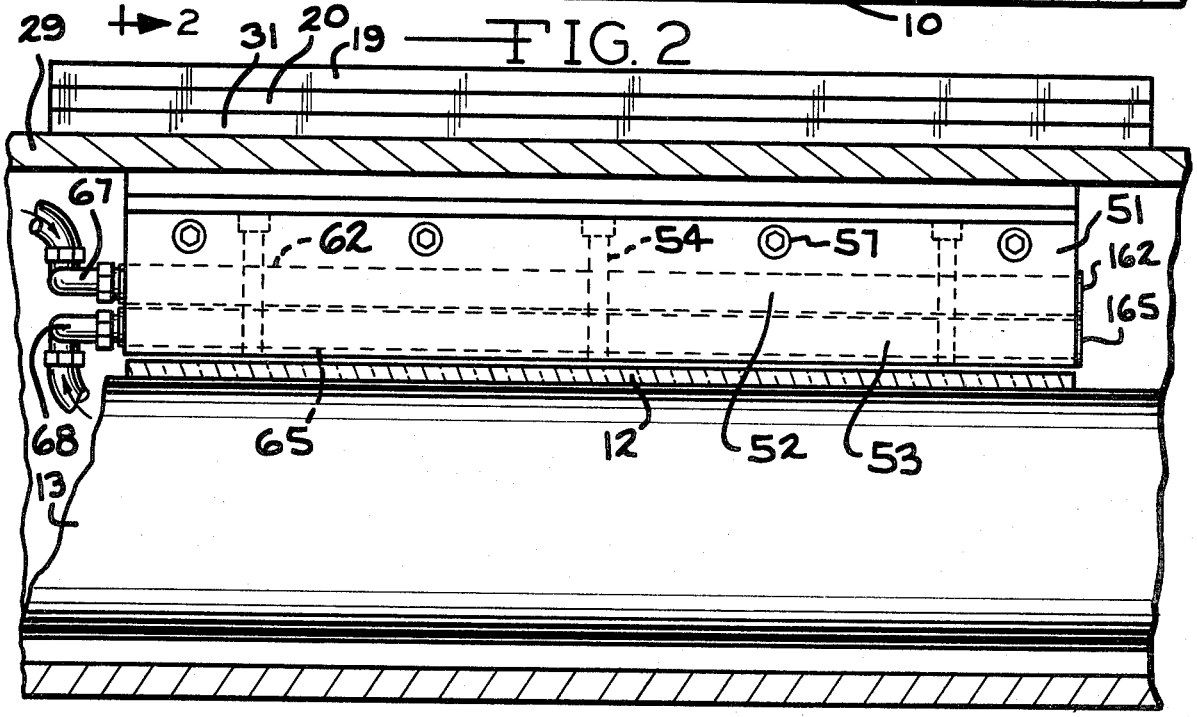
FIG. 2 is a side view of the apparatus taken substantially on line 2—2 of FIG. 1.

Referring to the drawings and particularly to that form of the invention illustrated in FIGS. 1 to 4, the sputtering apparatus includes an evacuable coating chamber 10 in which is mounted a planar sputtering cathode 11. The coating chamber is usually part of a continuous sputtering apparatus through which planar substrates 12, such as glass sheets or the like, are supported horizontally upon and carried by conveyor rolls 13 beneath cathode 12 to receive the coating material sputtered therefrom.

The cathode 11 comprises a housing of substantially rectangular boxlike form composed of a bottom wall or base plate 14, side walls 15 and 16, end walls 17 and 18 and a top or cover plate 19 which defined a chamber 20. Applied to the outer surface of the base plate 14 is a sheet or layer 21 of the material to be sputtered onto the substrates and which is generally referred to as the target.

The base plate 14 of the cathode housing is secured to the side and end walls 15–16 and 17–18 respectively by screws 22 which pass upwardly therethrough and are threaded into elongated metal strips 23 welded or otherwise suitably secured to the said side and end walls. Pressure tight seals 24 are provided between the base plate and the side and end walls, while arranged outwardly of said side and end walls are the insulating shields 25.

The side walls 15–16 and end walls 17–18 of the cathode housing terminate at their upper ends in outwardly directed flanges 26 and 27 respectively which form a continuous rim surrounding the housing for supporting the cathode in operative position. More particularly, the top wall 29 of coating chamber 10 is provided with a transverse opening 30 through which the cathode is lowered into said chamber where it is supported by the continuous rim which overlaps the adjacent portions of the top wall 29.

Strips of insulating material 31 are positioned between the top wall 29 of the coating chamber and the supporting rim, while pressure tight seals 32 and 33 are located at opposite sides of the insulating strips 31. Similar seals 34 are provided between the supporting rim and the cover plate 19 of the cathode.

The cathode 11 herein disclosed by way of illustration is a planar magnetron cathode and to this end magnetic means 35 are mounted in the cathode chamber 20 and supported on the base plate 14. The magnetic means 35 consists of two parallel rows of substantially U-shaped permanent magnets 36 and 37, with the magnets in the two rows being alternately arranged in overlapping relation.

The outer legs 38 of the magnets 36 are secured to a magnetic strip 39 by screws 40, while the outer legs of the magnets 37 are secured to a similar magnetic strip 42 by screws 43. The inner legs 44 and 45 of the magnets 36 and 37 are secured to a central magnetic strip 46, extending parallel with the strips 39 and 42, by screws 47 and 48 respectively.

The means for cooling the target are not shown as any desired means may be provided for this purpose. Likewise, the electrical means for operating the cathode are not shown since the operation of magnetron cathodes is well known.

In the operation of a cathode of the above character, an inert gas, such as argon, is usually admitted to the vacuum chamber 10 to provide a non-reactive gas atmosphere after the chamber has been pumped down to the desired pressure. This pressure is usually in the neighborhood of 5 to 10 microns. The argon is ionized to establish a plasma and the argon ions dislodge molecules of the material from which the target is made, these molecules then impinge upon the substrates that are moved slowly therebeneath to coat the same.

Such cathodes may also be employed to reactively sputter a metal oxide coating in a reactive gas atmosphere containing, for example, oxygen or nitrogen. However, the use of a reactive gas coming in contact with the target material is not without objections for the reasons stated above. Hence, the purpose of this invention is to provide a reactive sputtering apparatus which can be operated with greater efficiency and improved results than heretofore.

According to the present invention, there is provided a novel gas distribution system in which an inert gas, such as argon, is directed toward and into contact with the target, while a reactive gas, such as oxygen or nitrogen, is simultaneously directed toward and into contact with the substrate to be coated and in which the two gases are maintained substantially separated from one another. This allows the target to function as it would in a totally non-reactive environment, while the material liberated from the target and directed toward the substrate will be acted upon by the reactive gas in its path of movement or at the surface of the substrate as it would in a reactive environment.

To accomplish the objects of the invention, there is provided a gas distribution system including metallic support members 49 and 50 in the form of elongated substantially rectangular beams horizontally mounted in the coating chamber 10 at opposite sides of the cathode 11. Each support member is made up of three parallel sections 51, 52 and 53 positioned in contacting relation one above the other and secured together by screws 54.

The meeting faces of the sections 51 and 52 of each support member 49 and 50 are provided with semi-circular grooves 60 and 61 respectively which together form an annular opening extending longitudinally of said support member and in which is mounted a pipe 62 formed of a suitable porous material. The meeting faces of the support sections 52 and 53 are provided with similar semi-circular grooves 63 and 64 in which is mounted a pipe 65 also of porous material. As shown in FIG. 3, the porous pipes 62 at opposite sides of the cathode are closed at one end as at 162 while, at their opposite ends, they are joined to pipes 163 that extend inwardly and are connected to a gas inlet pipe 67. The porous pipes 65 at opposite sides of the cathode are closed at one end as at 165 and connected at their opposite ends to a gas inlet pipe 68. The porous pipe 62 is adapted to receive a non-reactive gas, such as argon, while the porous pipe 65 receives a reactive gas, such as oxygen or nitrogen.

The meeting faces of the sections 51 and 52 of each support member 49 and 50, inwardly of the porous pipe 62, are slanted upwardly and inwardly as at 69 and 70 and spaced slightly from one another to provide a slit 71 (FIG. 4) through which the non-reactive or inert gas escaping through the porous pipe 62 will be directed toward and upon the target 21. Similarly, the meeting faces of the sections 52 and 53 of each support member inwardly of the porous pipe 65 slant inwardly and downwardly as at 72 and 73 and are spaced slightly from one another to provide a slit 74 through which the reactive gas escaping through the porous pipe 65 will be directed toward and upon the substrate 12. In this way, the target face will be shielded from the reactive gas by the layer of non-reactive gas which is next to the target. Thus, the sputtering from the target face takes place in a non-reactive gas atmosphere, while the reaction desired takes place in a reactive gas atmosphere at or adjacent to the substrate.

In practice, the coating chamber is first pumped down to the desired pressure and an inert gas, such as argon, introduced into the upper portion thereof through the porous pipes 62. The reactive gas, such as oxygen or nitrogen, is then introduced through the porous pipe 65 into the lower portion of the chamber. The gas introduced into the upper portion of the chamber is usually 100% inert gas, such as argon, while the gas introduced into the lower portion of the chamber is not necessarily 100% reactive gas. This gas may be a mixture of argon and oxygen or nitrogen; for example 80% oxygen or nitrogen and 20% argon. The presence of the argon gas above the reactive gas will prevent the reactive gas from passing upwardly into contact with the target face.

The target may be formed of a pure metal such as titanium or tantalum. When the reactive gas used is oxygen and the molecules of titanium or tantalum are sputtered from the target they will be convered into titanium oxide or tantalum oxide respectively when they hit the oxygen. Likewise, when nitrogen gas is used the titanium and tantalum molecules will be converted into titanium nitride and tantalum nitride.

To control the amount of gas introduced into the vacuum chamber 10, set screws 75 and 76 are threaded through the top and bottom sections 51 and 53 of each support member 49 and 50 and are received within openings 77 and 78 in the central section 52. Upon rotation of the set screws, the meeting faces 69-70 and 72-73 can be sprung slightly toward or away from one another to increase or decrease the width of the slits and thus regulate the amount of gas passing therethrough.

In FIGS. 5 to 7 is illustrated an alternate form of gas distribution system embodying the basic features of the invention as described above. The cathode illustrated in FIG. 5 is the same as in FIGS. 1 to 3 so that like numerals have been used to designate like parts.

The gas distribution system herein disclosed comprises a rectangular frame 77 which encircles the lower portion of the cathode 11 within vacuum chamber 10 and is secured to the underside of the top wall 29 of said chamber by brackets 78. The frame is composed of upper and lower horizontal tubular side members 79 and 80 integral with the tubular end members 81 and 82. The upper and lower side and end members are joined together by the side and end metal plate members 83 and 84 respectively.

The gases are introduced into the upper and lower tubular side members 79 and 80 through feed pipes 85 and 86 and exit therefrom and from the end members 81 and 82 through aperatures 87 and 88 respectively. The openings 87 in the upper tubular members are positioned to direct an inert gas upwardly and inwardly toward the target 21, while the openings 88 in the lower tubular members are positioned to direct a re-active gas, or a mixture of inert and reactive gases, downwardly and inwardly toward the substrate 12 as explained above.

The operation and advantages of this form of the invention are the same as those above described with relation to that form of the invention illustrated in FIGS. 1 to 4.

Modifications may be made without departing from the spirit or scope of the invention as defined in the appended claims.

I claim:

1. A gas distribution system for use with a sputtering cathode mounted in a vacuum chamber and having a substantially planar target formed of the material to be sputtered onto substantially planar substrates located therebeneath, comprising distributor means at each side of said cathode for introducing two separate gases into the vacuum chamber between the target and the substrates, said distributor means comprising a support member, a pair of horizontal porous pipes located within said support member, and outlets in the support member through which the gases escape from the porous pipes into said vacuum chamber and by which the gases are directed in divergent directions, one toward the target and the other toward the substrates.

2. A gas distribution system as claimed in claim 1, in which said outlets are in the form of relatively narrow slits, and including means for varying the width of the slits to control the flow of gas from said porous pipes into said chamber.

3. A gas distribution system as claimed in claim 1, in which each said support member includes a top section a bottom section and a central section, means for securing said sections together in surrounding relation to the porous pipes, the adjacent sections being spaced from one another inwardly of said porous pipes to provide outlets through which the gases escape from the porous pipes into said chamber, one of said outlets being directed inwardly and upwardly toward the target and the other outlet being directed inwardly and downwardly toward the substrates.

4. A gas distribution system as claimed in claim 3, in which said outlets consist of relatively narrow slits between adjacent sections, and including means carried by the top and bottom sections and engaging the central section for varying the width of the slits to control the flow of gas from the porous pipes into the chamber.

5. A gas distribution system as claimed in claim 4, in which said means comprises set screws passing through the top and bottom sections opposite said slits and engaging the central section for springing said sections relative to one another to vary the width of said slits.

* * * * *